United States Patent
Itoh et al.

(10) Patent No.: US 6,660,455 B2
(45) Date of Patent: Dec. 9, 2003

(54) PATTERN FORMATION MATERIAL, PATTERN FORMATION METHOD, AND EXPOSURE MASK FABRICATION METHOD

(75) Inventors: Masamitsu Itoh, Yokohama (JP); Takehiro Kondoh, Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/812,688

(22) Filed: Mar. 21, 2001

(65) Prior Publication Data

US 2001/0026895 A1 Oct. 4, 2001

(30) Foreign Application Priority Data

Mar. 22, 2000 (JP) ........................................ 2000-080093

(51) Int. Cl.$^7$ .............................. G03F 7/00; G03F 7/004
(52) U.S. Cl. .................... 430/311; 430/270.1; 430/313; 430/314; 430/317; 430/329; 430/942; 430/296; 430/30
(58) Field of Search ............................... 430/311, 270.1, 430/942, 314, 313, 317, 329, 296, 30

(56) References Cited

U.S. PATENT DOCUMENTS

| 5,985,524 A | * 11/1999 | Allen et al. | .................. 430/326 |
| 6,380,317 B1 | * 4/2002 | Malik et al. | ................. 522/266 |

FOREIGN PATENT DOCUMENTS

| JP | 8-262721 | 10/1996 |
| JP | 9-6002 | 1/1997 |
| JP | 9-6003 | 1/1997 |
| JP | 9-22117 | 1/1997 |
| JP | 9-127698 | 5/1997 |
| JP | 9-179301 | 7/1997 |
| JP | 9-219355 | 8/1997 |
| JP | 10-10738 | 1/1998 |
| JP | 11-15163 | 1/1999 |
| JP | 11-218925 | 8/1999 |
| JP | 11-231542 | 8/1999 |
| JP | 11-271965 | 10/1999 |
| JP | 11-282166 | 10/1999 |
| JP | 2000-66405 | 3/2000 |

OTHER PUBLICATIONS

English abstract of JP 09–006002.*
English abstract of JP 08–262721.*
English abstract and partial machine translation from JPO website of 11–271965.*

* cited by examiner

Primary Examiner—Janet Baxter
Assistant Examiner—Amanda C. Walke
(74) Attorney, Agent, or Firm—Finnegan, Henderson, Farabow, Garrett & Dunner, L.L.P.

(57) ABSTRACT

This invention provides a pattern formation material for electron beam lithography, which contains an alkali-soluble resin, a photoacid generator, and dissolution inhibiting groups, and also provides a pattern formation method and exposure mask fabrication method using the material. As the dissolution inhibiting groups, this invention uses a first dissolution inhibiting group which increases the sensitivity of the pattern formation material when the material is left to stand in a vacuum after an electron beam irradiation, and a second dissolution inhibiting group which decreases the sensitivity under the same condition. In this invention, the ratio of the first dissolution inhibiting group to the second dissolution inhibiting group is so adjusted that the size of an alkali-soluble portion, which is made soluble in an alkali solution by an electron beam irradiation, is substantially held constant independently of the standing time in a vacuum.

12 Claims, 3 Drawing Sheets

PATTERN FORMATION MATERIAL, PATTERN FORMATION METHOD, AND EXPOSURE MASK FABRICATION METHOD

CROSS-REFERENCE TO RELATED APPLICATIONS

This application is based upon and claims the benefit of priority from the prior Japanese Patent Application No. 2000-080093, filed Mar. 22, 2000, the entire contents of which are incorporated herein by reference.

BACKGROUND OF THE INVENTION

The present invention relates to a pattern formation material, pattern formation method, and exposure mask fabrication method and, more particularly, to a pattern formation material for electron beam lithography, a pattern formation method using the pattern formation material, and an exposure mask fabrication method using the pattern formation material.

Recently, chemically amplified resists are often used in the fabrication processes of semiconductor devices. These chemically amplified resists are roughly classified into positive resists and negative resists. Known examples of the positive chemically amplified resists are a ternary composition containing an alkali-soluble resin, dissolution inhibitor, and photoacid generator, and a binary composition containing an alkali-soluble resin to which a substituent (dissolution inhibiting group) having dissolution inhibiting capacity is introduced, and a photoacid generator.

When a positive chemically amplified resist is used, the dissolution of the alkali-soluble resin is inhibited in an unexposed state by the dissolution inhibitor or the dissolution inhibiting group. When this resist is irradiated with chemical radiation to generate an acid from the photoacid generator and the resultant resist is subjected to post-exposure baking (PEB), the dissolution inhibitor or the dissolution inhibiting group is decomposed by the generated acid to lose its dissolution inhibiting capacity. Since this makes an exposed portion of the positive chemically amplified resist soluble in alkali, the resist is selectively removed by development using an alkali developer.

In this chemically amplified resist, the acid generated when the photoacid generator is irradiated with chemical radiation functions as a catalyst. When this chemically amplified resist is used, therefore, a plurality of molecules can be reacted by one photon. That is, higher sensitivity than those of conventional resists can be obtained by the chemically amplified resist.

In a patterning process using the chemically amplified resist described above, a resist film is irradiated at once with ultraviolet radiation through a desired pattern, and a resist pattern obtained by developing the irradiated resist film is used as an etching mask to pattern a thin film. This resist pattern is required to decrease the pattern size and increase the shape accuracy. In effect, many proposals have been made to meet these requirements.

For example, Jpn. Pat. Appln. KOKAI Publication No. 8-262721 disclosed a binary chemically amplified resist composition containing, as alkali-soluble resins, polyhydroxystyrene in which 10 to 60 mol % of a hydroxyl group are substituted by a tert-butoxycarbonyloxy group (t-BOC group), and polyhydroxystyrene in which 10 to 60 mol % of a hydroxyl group are substituted by a residual group indicated by formula —$OCR^1R^2OR^3$. Jpn. Pat. Appln. KOKAI Publication No. 8-262721 describes that this resist composition realizes high sensitivity, high resolution, and high heat resistance because the solubility of the alkali-soluble resins and the dissolution stopping power are well balanced by using the t-BOC group and the residual group indicated by formula —$OCR^1R^2OR^3$ ($R^1$ represents a hydrogen atom or methyl group, $R^2$ represents a methyl group or ethyl group, and $R^3$ represents a lower alkyl group) as dissolution inhibiting groups.

Jpn. Pat. Appln. KOKAI Publication No. 9-6002 describes that when the conventional chemically amplified resists are used, bridging occurs in the upper portion of an opening in the resist pattern because an acid generated by exposure is deactivated. This deactivation of the acid is brought about by ammonia or the like contained in the atmosphere in a clean room. As a solution to this problem, Jpn. Pat. Appln. KOKAI Publication No. 9-6002 disclosed a positive chemically amplified resist composition formed by further adding an organic carboxylic acid compound to the composition disclosed in Jpn. Pat. Appln. KOKAI Publication No. 8-262721. Note that Jpn. Pat. Appln. KOKAI Publication Nos. 9-6003, 9-22117, 9-127698, and 10-10738 also disclosed chemically amplified resist compositions similar to those disclosed in Jpn. Pat. Appln. KOKAI Publication Nos. 8-262721 and 9-6002.

Like Jpn. Pat. Appln. KOKAI Publication No. 9-6002, Jpn. Pat. Appln. KOKAI Publication No. 9-219355 describes that when the conventional chemically amplified resists are used, an acid generated by exposure is deactivated by ammonia or the like contained in the atmosphere in a clean room, and the section of the resist pattern assumes a T-top profile. As a method of solving this problem, Jpn. Pat. Appln. KOKAI Publication No. 9-219355 describes that the resist composition is so controlled that the film reduction amount is increased when the sectional shape of the resist pattern has a T-top profile, and that the film reduction amount is decreased when the sectional shape of the resist pattern has a sloping shoulders-like profile.

Any of the above Published Unexamined Patent Applications mainly describes that ultraviolet radiation is used to expose the chemically amplified resist disclosed in it. Recently, however, electron beam writing is beginning to be used in addition to ultraviolet exposure described above.

Theoretically, electron beam writing can increase the resolution to the beam diameter of an electron beam. That is, electron beam writing is more suitable for finer fabrication than ultraviolet exposure. Therefore, electron beam writing is used when ultrafine fabrication is necessary, such as in the fabrication of pattern formation masks, e.g., a general photomask, electron beam exposure mask, X-ray lithography mask, EUV (Extreme UltraViolet) lithography mask, and stencil mask.

Unfortunately, when an electron beam is used as chemical radiation, peculiar problems that cannot occur in ultraviolet exposure take place. For example, Jpn. Pat. Appln. KOKAI Publication No. 11-271965 describes that no resist patterns having good sectional shapes can be obtained when electron beam exposure is performed by using a chemically amplified resist containing a polymer having an acetal-type acid leaving group. Jpn. Pat. Appln. KOKAI Publication No. 11-27165 also describes that the cause of this defect is that the release reaction from a polymer having an acetal-type acid leaving group requires water, but the conventional methods cannot allow a resist film to absorb sufficient moisture. This lacking of water occurs because electron beam writing is performed in a vacuum, unlike ultraviolet exposure. As a method of solving this problem, Jpn. Pat. Appln. KOKAI Publication No. 11-271965 disclosed a method by which a resist film is allowed to absorb moisture as it is left to stand in the air between exposure and PEB.

The use of an electron beam as chemical radiation also poses other characteristic problems. When an electron beam is used as chemical radiation, exposure cannot be performed at once unlike when ultraviolet radiation is used. That is, writing must be gradually performed when an electron beam is used. Hence, in the fabrication of a pattern formation mask described above, writing of a resist film sometimes takes a long time of 10 hr or more. When this is the case, the diffused state of an acid generated by exposure of a chemically amplified resist differs in the writing end position largely from that in the writing start position.

At present, the dimensional accuracy required for electron beam writing used in the semiconductor device fabrication processes is on the nanometer order. However, some conventional technologies produce a dimensional difference of about 30 nm between the writing start and end positions. Such a dimensional difference obviously does not satisfy the above requirement and hence is a large cause of a lowering of the yield.

As described above, the influence the time required for electron beam writing has on the dimensional accuracy is extremely large. However, the known chemically amplified resists are formed assuming principally ultraviolet exposure and hence do not take these problems special to electron beam writing into consideration. In fact, the above problems are not at all described not only in the Published Unexamined Patent Publications enumerated in connection with ultraviolet exposure but also in the Published Unexamined Patent Publications enumerated in relation to electron beam writing. That is, the problems described above in connection with electron beam writing have not been solved yet.

BRIEF SUMMARY OF THE INVENTION

It is an object of the present invention to provide a pattern formation material, pattern formation method, and exposure mask fabrication method capable of fabricating a pattern formation mask with high yield.

It is another object of the present invention to realize high dimensional accuracy during patterning using electron beam lithography.

According to the first aspect of the present invention, there is provided a pattern formation material for electron beam lithography, comprising an alkali-soluble resin and a photoacid generator which generates an acid when irradiated with an electron beam, wherein the pattern formation material further comprises first and second dissolution inhibiting groups each of which has a capacity of inhibiting dissolution of the alkali-soluble resin in an alkali solution and loses the capacity upon application of an acid, the first dissolution inhibiting group increasing the sensitivity of the pattern formation material when left to stand in a vacuum after irradiated with an electron beam, and the second dissolution inhibiting group decreasing the sensitivity of the pattern formation material when left to stand in a vacuum after irradiated with an electron beam, and the ratio of the first dissolution inhibiting group to the second dissolution inhibiting group is adjusted such that the size of an alkali-soluble portion, which is a portion made soluble in the alkali solution when the pattern formation material is irradiated with an electron beam, is substantially held constant independently of the standing time in a vacuum.

According to the second aspect of the present invention, there is provided a pattern formation method using a pattern formation material for electron beam lithography, the pattern formation material comprising an alkali-soluble resin and a photoacid generator which generates an acid when irradiated with an electron beam, the pattern formation material further comprising first and second dissolution inhibiting groups each of which has a capacity of inhibiting dissolution of the alkali-soluble resin in an alkali solution and loses the capacity upon application of an acid, the first dissolution inhibiting group increasing the sensitivity of the pattern formation material when left to stand in a vacuum after irradiated with an electron beam, and the second dissolution inhibiting group decreasing the sensitivity of the pattern formation material when left to stand in a vacuum after irradiated with an electron beam, comprising the steps of determining the ratio of the first dissolution inhibiting group to the second dissolution inhibiting group such that the size of an alkali-soluble portion, which is a portion made soluble in the alkali solution when the pattern formation material is irradiated with an electron beam, is substantially held constant independently of the standing time in a vacuum, forming a photosensitive film by coating the surface of an object to be processed with the pattern formation material containing the first and second dissolution inhibiting groups at the determined ratio, performing electron beam writing on the photosensitive film, and forming a patterned film by developing the photosensitive film subjected to the electron beam writing.

According to the third aspect of the present invention, there is provided an exposure mask fabrication method using a pattern formation material for electron beam lithography, the pattern formation material comprising an alkali-soluble resin and a photoacid generator which generates an acid when irradiated with an electron beam, the pattern formation material further comprising first and second dissolution inhibiting groups each of which has a capacity of inhibiting dissolution of the alkali-soluble resin in an alkali solution and loses the capacity upon application of an acid, the first dissolution inhibiting group increasing the sensitivity of the pattern formation material when left to stand in a vacuum after irradiated with an electron beam, and the second dissolution inhibiting group decreasing the sensitivity of the pattern formation material when left to stand in a vacuum after irradiated with an electron beam, comprising the steps of determining the ratio of the first dissolution inhibiting group to the second dissolution inhibiting group such that the size of an alkali-soluble portion, which is a portion made soluble in the alkali solution when the pattern formation material is irradiated with an electron beam, is substantially held constant independently of the standing time in a vacuum, forming a light-shielding film on one principal surface of a transparent substrate, forming a photosensitive film by coating the surface of the light-shielding film with the pattern formation material containing the first and second dissolution inhibiting groups at the determined ratio, performing electron beam writing on the photosensitive film, forming a patterned film by developing the photosensitive film subjected to the electron beam writing, and etching the light-shielding film by using the patterned film as an etching mask.

The term "increasing the sensitivity" means that assuming the electron beam irradiation amount and the development conditions are constant, the aperture size of a pattern formed by exposing and developing a thin film made of the pattern formation material increases, i.e., means that a desired aperture size is realized with a smaller electron beam irradiation amount. On the other hand, the term "decreasing the sensitivity" means that assuming the electron beam irradiation amount and the development conditions are constant, the aperture size of a pattern formed by exposing and developing a thin film made of the pattern formation material decreases, i.e., means that the realization of a desired aperture size requires a larger electron beam irradiation amount. Furthermore, the term "alkali-soluble portion" means a portion dissolvable in an alkali solution when development is performed under predetermined conditions.

As described above, when a general chemically amplified resist is left to stand in a vacuum after electron beam writing, an acid diffuses to increase the sensitivity of the material. When a chemically amplified resist containing an acetal-type dissolution inhibiting group is used, on the other hand, it is possible to obtain a resist pattern having a good sectional shape by allowing a resist film to well absorb moisture between electron beam writing and PEB. That is, in the absence of water, no release reaction of the acetal-type dissolution inhibiting group occurs.

In addition to these facts, the present inventors noted that electron beam writing is performed in a vacuum unlike ultraviolet exposure, and examined sensitivity changes produced when the resist was left to stand in a vacuum after electron beam writing. Consequently, the present inventors have found that a chemically sensitized resist having an acetal-type dissolution inhibiting group decreases its sensitivity when left to stand in a vacuum after electron beam writing, and that when such a chemically amplified resist which decreases its sensitivity and a chemically amplified resist which increases its sensitivity are mixed at an appropriate ratio, a resist pattern having a uniform size can be formed independently of the standing time in a vacuum after electron beam writing. That is, the present invention can realize high dimensional accuracy when patterning is performed using electron beam writing. Therefore, the present invention makes it possible to fabricate a pattern formation mask and the like with high yield.

In the present invention as described above, the ratio (commonly the molar ratio) of the first dissolution inhibiting group to the second dissolution inhibiting group must be so set that the size of an alkali-soluble portion made soluble in an alkali solution by an electron beam irradiation is maintained substantially constant independently of the standing time in a vacuum, i.e., that the size variation with the vacuum standing time is substantially zero. However, this size variation need not be completely zero. That is, the size of the alkali-soluble portion can slightly change with the standing time in a vacuum.

Usually, the dimensional accuracy required for electron beam writing for fabricating an exposure mask for use in the fabrication process of semiconductor devices is ±10 nm. Also, the longest time required for electron beam writing for fabricating an exposure mask is normally 10 hr. Accordingly, the ratio of the first dissolution inhibiting group to the second dissolution inhibiting group need only be so controlled that the size variation is 5 nm or less for a vacuum standing time of 10 hr, when other size variation factors are taken into account. The ratio is preferably so controlled that the size variation is 3 nm or less for a vacuum standing time of 10 hr.

In the present invention, the ratio of the alkali-soluble resin, dissolution inhibiting groups, photoacid generator, and the like in the pattern formation material is determined in accordance with the necessary sensitivity, resolution, and the like, as in the case of general positive chemically amplified resists. In other words, the ratio of the alkali-soluble resin, dissolution inhibiting groups, photoacid generator, and the like has a very large influence on the essential resist characteristics such as the sensitivity and resolution of the pattern formation material.

As described above, the present invention uses the method of controlling the ratio of the first dissolution inhibiting group to the second dissolution inhibiting group. Therefore, the size variation with the vacuum standing time can be decreased to substantially zero without changing the ratio of the dissolution inhibiting groups to the alkali-soluble resin, photoacid generator, or the like. That is, the size variation with the vacuum standing time can be decreased to substantially zero with almost no effect on the sensitivity, resolution, and the like of the pattern formation material. Accordingly, the present invention eliminates the need for an enormous number of tests in determining the composition of a pattern formation material by which the above-mentioned characteristics are given.

Examples of the alkali-soluble resin usable in the present invention are polymer materials generally used in chemically amplified resists. Specific examples are polyhydroxystyrene, a hydroxystyrene-styrene copolymer, an isopropenylphenol-styrene copolymer, a hydroxystyrene-methyl methacrylate copolymer, an isopropenylphenol-methyl methacrylate copolymer, a phenol novolak resin, a cresol novolak resin, a xylenol novolak resin, poly(4-carboxyadamantane)methacrylate, and a copolymer of 4-carboxynorbornene and maleic anhydride. These polymer materials can be used singly or in the form of a mixture.

In the present invention, as the first dissolution inhibiting group which increases the sensitivity when the pattern formation material is left to stand in a vacuum after exposure, functional groups used in common chemically amplified resists can be used. Examples are a t-butoxycarbonyloxy group, t-butylester group, methoxyethoxyester group, t-butoxycarbonyloxymethoxy group, t-pentylester group, t-hexylester group, 1-cyclohexenylester group, 2-cyclopropyl-2-propylester group, 2-phenyl-2-propyl group, and 1-methoxyethylester group. The pattern formation material of the present invention can contain either only one type of a group or a plurality of types of groups selected from these functional groups, as the first dissolution inhibiting group.

In the present invention, as the second dissolution inhibiting group which decreases the sensitivity when the pattern formation material is left to stand in a vacuum after exposure, it is possible to use, for example, an acetal-type functional group represented by the following formula, tetrahydropyranyl group, silylether group, enolether compound, O,N-acetal compound, acidoacetal group, silylester compound, and orthoester group. The pattern formation material of the present invention can contain either only one type of a group or a plurality of types of groups selected from these functional groups, as the second dissolution inhibiting group.

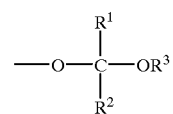

(wherein $R^1$ represents a hydrogen atom or methyl group, $R^2$ represents a methyl group or ethyl group, and $R^3$ represents a lower alkyl group.)

The pattern formation material of the present invention can contain the above first and second dissolution inhibiting groups as functional groups which modify the alkali-soluble resin mentioned earlier. Also, the pattern formation material of the present invention can contain the above first and second dissolution inhibiting groups as a dissolution inhibitor having these dissolution inhibiting groups. That is, the pattern formation material of the present invention can be either a binary composition or a ternary composition. Furthermore, the pattern formation material of the present invention can contain one of the first and second dissolution inhibiting groups as a functional group which partially modifies the alkali-soluble resin, and the other of the first and second dissolution inhibiting groups as a functional group forming a dissolution inhibitor.

In the present invention, examples of the photoacid generator for generating an acid when irradiated with an electron beam are photoacid generators generally used in chemically amplified resists. Specific examples are onium salts and an iminosulfonate compound such as triphenylsulfonium, trifluoromethanesulfonate, and triphenylsulfodi (4-t-butylphenyl)iodoniumcamphorsulfonate, a disulfone compound, and a halogen compound. These photoacid generators can be used singly or in the form of a mixture.

The pattern formation material of the present invention can further contain a solvent and the like. Furthermore, in addition to the above components, the pattern formation material of the present invention can contain slight amounts of additives.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

An embodiment of the present invention will be described below.

Figure 1:
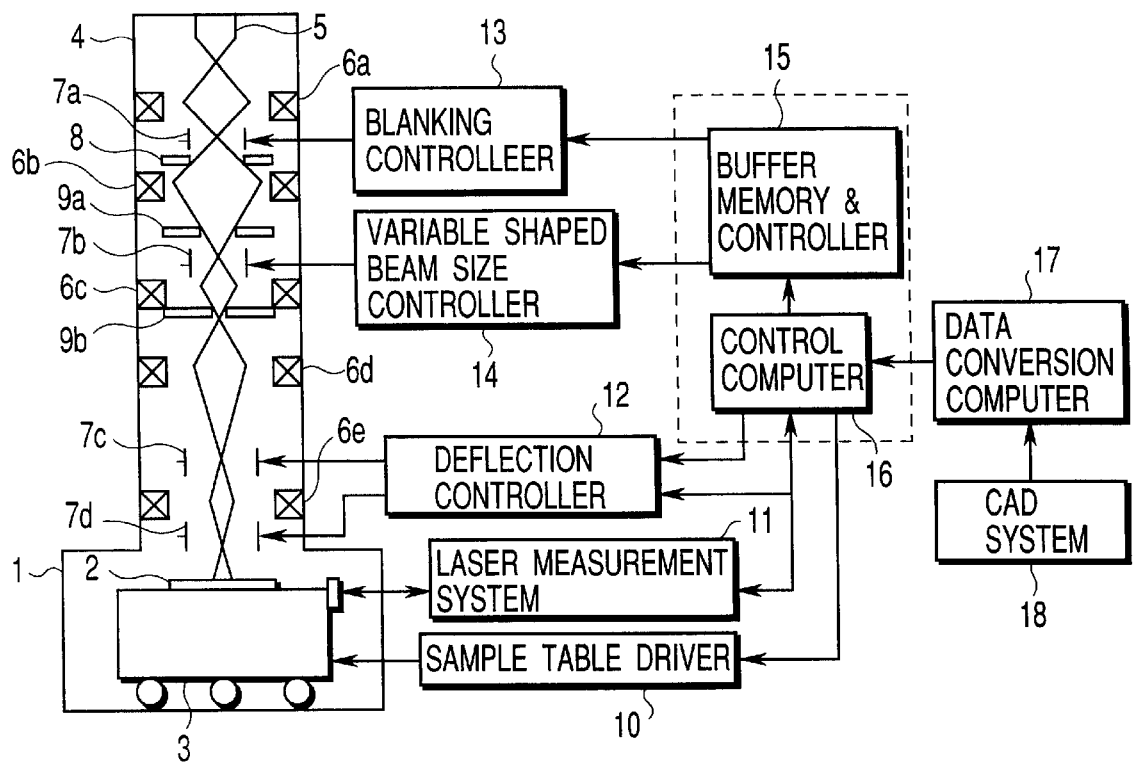
FIG. 1 is a view schematically showing an electron beam writing apparatus used in an embodiment of the present invention.

FIG. 1 is a view schematically showing an electron beam writing apparatus used in the embodiment of the present invention. This electron beam writing apparatus shown in FIG. 1 has a sample chamber 1. The sample chamber 1 contains a sample table 3, and a sample 2 is placed on this sample table 3. An electronic optical lens-barrel 4 extends in the upper portion of the sample chamber 1. An electron gun 5 is placed in the uppermost portion of the electronic optical lens-barrel 4. Between this electron gun 5 in the electronic optical lens-barrel 4 and the sample chamber 1, various lens systems 6a to 6e, various deflecting systems 7a to 7d, a blanking plate 8, and beam shaping apertures 9a and 9b are arranged.

The electron beam writing apparatus shown in FIG. 1 further includes a control computer 16. This control computer 16 is connected to a CAD system 18 via a data conversion computer 17. The control computer 16 is also connected to a laser measurement system 11, a sample table driver 10, a deflection controller 12, and a buffer memory & controller 15. A blanking controller 13 and a variable shaped beam size controller 14 are connected to the buffer memory & controller 15.

In the electron beam writing apparatus shown in FIG. 1, the blanking deflector 7a controls irradiation/non-irradiation of the sample 2 with an output electron beam from the electron gun 5. The beam shaping deflector 7b and the beam shaping apertures 9a and 9b shape the electron beam passing through the blanking plate 8 into a rectangular beam and also control the beam size. The scanning deflectors 7c and 7d scan the shaped beam by deflection on the sample 2. In this manner, a desired pattern is written on the sample 2. Note that the acceleration voltage of the electron beam apparatus used in this embodiment is 50 kV, and the maximum size of a rectangular beam that can be generated is 2 $\mu$m square.

In this embodiment, a patterning process explained below was carried out by using the above-mentioned electron beam writing apparatus.

That is, PHS (PolyHydroxyStyrene) as an alkali-soluble resin was used as a base polymer, and a portion of a hydroxyl group of this PHS was substituted with an ethoxyethyl group (a functional group represented by the above formula, in which $R^1$ is a hydrogen atom, $R^2$ is an ethyl group, and $R^3$ is an ethoxy group) as an acetal-type functional group and with a t-BOC group (tert-butoxycarbonyloxy group). Also, an onium salt was used as a PAG (photoacid generator). By using these materials, positive chemically amplified resists containing the PHS modified by the above functional group and the onium salt was prepared. In this embodiment, five types of chemically modified resists in which the molar ratios of the acetal-type functional group to the t-BOC group were 1:99, 5:95, 10:90, 20:80, and 50:50 were prepared.

Subsequently, one substrate was coated with each of these resists to form a 50-nm resist film. The film thickness uniformity of this resist film was 1% or less in a square region of 140 mm side. These substrates coated with the resists were heated at 110° C. for 10 min by using a hot plate.

After that, these substrates were loaded as samples 2 into the sample chamber 1 of the electron beam writing apparatus shown in FIG. 1. One hundred 0.2-$\mu$m wide line & space patterns were sequentially written every two hours with an irradiation amount of 8 $\mu$C/cm$^2$, thereby writing the line & space patterns on 11 chips. Accordingly, the time from the start of writing on the first chip to the end of writing on the last chip was 20 hours.

Immediately after the writing of the 11th chip was completed, PEB was performed at 110° C. for 10 min in an atmosphere in which the amine concentration was controlled to 3 ppb or less by a chemical filter. The in-plane uniformity of the PEB temperature was ±0.3° C. or less. Subsequently, spray development was performed for 80 sec by using the AD10 alkali developer manufactured by Tama Kagaku, which was controlled at a temperature of 23° C. In this way, resist patterns made up of lines and spaces were formed.

Finally, the aperture widths of these resist patterns were measured using a scanning electron microscope (SEM). The results are shown in FIG. 2.

Figure 2:
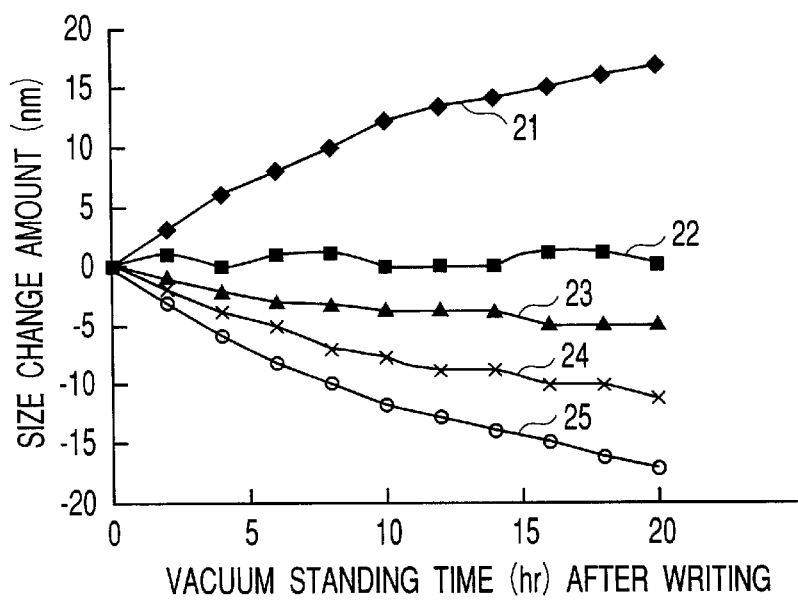
FIG. 2 is a graph showing the relationships between the time during which exposed resist films were left to stand in a vacuum and the aperture widths of resist patterns.

FIG. 2 is a graph showing the relationships between the time during which the exposed resist films were left to stand in a vacuum and the aperture widths of the resist patterns. Referring to FIG. 2, the abscissa indicates the time during which the exposed resist films were left to stand in a vacuum, and the ordinate indicates the differences of the aperture widths of the resist patterns from the design value. Reference numerals 21, 22, 23, 24, and 25 denote data obtained when the molar ratios of the acetal-type functional group to the t-BOC group were 1:99, 5:95, 10:90, 20:80, and 50:50, respectively.

As the data 21 shows in FIG. 2, when the molar ratio of the acetal-type functional group to the t-BOC group was 1:99, the aperture width increased as the standing time in a vacuum elapsed. That is, in this case the resist sensitivity increased with the elapse of the standing time in a vacuum.

On the other hand, as the data 25 shows in FIG. 2, when the molar ratio of the acetal-type functional group to the t-BOC group was 50:50, the aperture width reduced as the standing time in a vacuum elapsed. That is, in this case the resist sensitivity lowered with the elapse of the standing time in a vacuum.

By contrast, as the data 22 shows in FIG. 2, when the molar ratio of the acetal-type functional group to the t-BOC group was 5:95, the aperture width remained substantially constant independently of the elapse of the standing time in a vacuum. In this embodiment, the target dimensional accuracy after a vacuum standing time of 10 hr was ±3 nm, in order to fabricate a photomask to be described below. As shown in FIG. 2, the target was well achieved when the molar ratio of the acetal-type functional group to the t-BOC group was 5:95.

A photomask was fabricated by using the resist in which the molar ratio of the acetal-type functional group to the t-BOC group was 5:95. This fabrication will be described below with reference to FIGS. 3A to 3E.

Figure 3A:
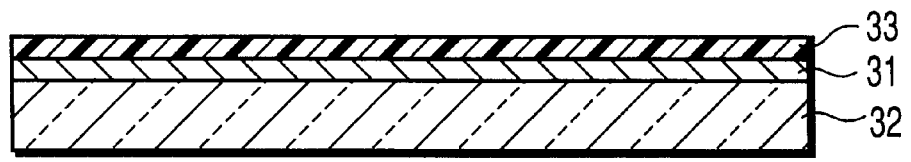
FIGS. 3A to 3E are sectional views schematically showing the fabrication process of a photomask according to the embodiment of the present invention.

FIGS. 3A to 3E are sectional views schematically showing the photomask fabrication process according to the embodiment of the present invention. In fabricating a photomask 30 shown in FIG. 3E, a quartz crystal substrate 32 on one principal surface of which a chromium film 31 was formed was first prepared as shown in FIG. 3A. This chromium film 31 was coated with the resist in which the molar ratio of the acetal-type functional group to the t-BOC group was 5:95, thereby forming a 500-nm thick resist film 33.

Figure 3B:
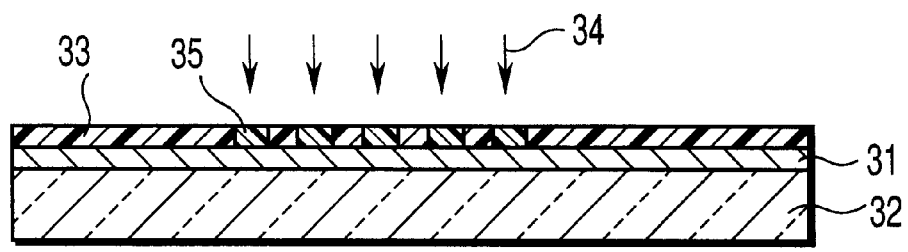
Figure 3C:
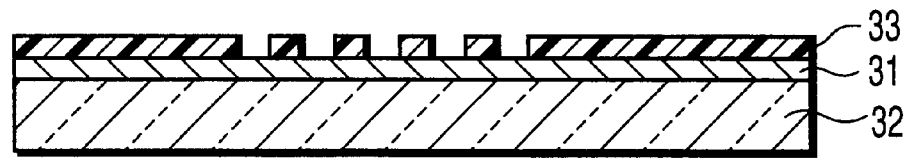

After that, baking was performed at 110° C. for 10 min. In addition, as shown in FIG. 3B, the electron beam writing apparatus shown in FIG. 1 was used to perform writing on the resist film 33 under the following conditions. Note that in FIG. 3B, reference numeral 34 denotes electron beams; and 35, exposed portions of the resist film 33.

That is, to increase the pattern positional accuracy, each stripe was written four times with an irradiation amount of 2 $\mu C/cm^2$. More specifically, each stripe was written by multiple writing such that the total irradiation amount was 8 $\mu C/cm^2$. In this embodiment, a 4G-DRAM device isolation pattern was written, and it took 8 hr to complete the entire writing.

After the writing was completed, PEB was performed at 110° C. for 15 min in an atmosphere in which the amine concentration was controlled to 3 ppb or less by a chemical filter. The in-plane uniformity of the PEB temperature was ±0.3° C. or less. Subsequently, spray development was performed for 80 sec by using the AD10 alkali developer manufactured by Tama Kagaku, which was controlled at a temperature of 23° C. The resist film 33 was thus patterned to obtain a resist pattern 33 shown in FIG. 3C.

Figure 3D:
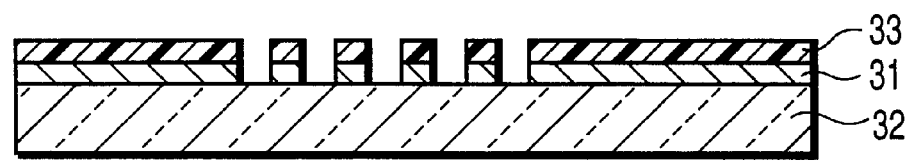

As shown in FIG. 3D, an MEPS-6025 RIE (Reactive Ion Etching) system manufactured by ULCOAT was used to etch the chromium film 31 by using the resist pattern 33 as an etching mask. Note that a gas mixture of chlorine and oxygen was used as an etching gas, the flow rate of the chlorine gas was 20 sccm, the flow rate of the oxygen gas was 80 sccm, and the pressure was 6.8 Pa. Note also that the input power was 150 W, and the etching time was 450 sec.

Figure 3E:
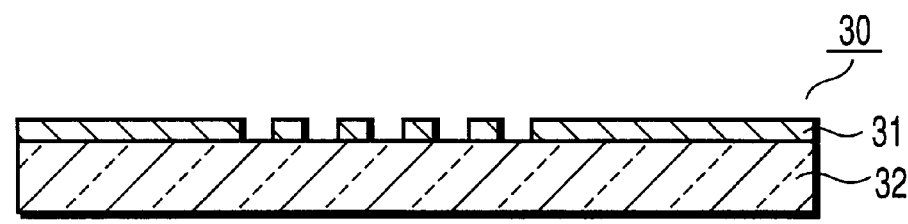

After the etching, as shown in FIG. 3E, the resist pattern 33 was removed, and the substrate was cleaned. In this way, a photomask 30 having a structure in which the chromium light-shielding pattern 31 was formed on the quartz substrate 32 was fabricated.

For comparison, a photomask 30 was fabricated following the same procedures as above except that EP-002 manufactured by TOKYO OHKA KOGYO CO., LTD. as a conventional resist was used instead of the resist in which the molar ratio of the acetal-type function group to the t-BOC group was 5:95. After that, the aperture width, i.e., the pattern size of the light-shielding pattern 31 of each of the two photomasks 30 fabricated by the above methods was measured using an SEM. The results are shown in FIGS. 4 and 5.

Figure 4:
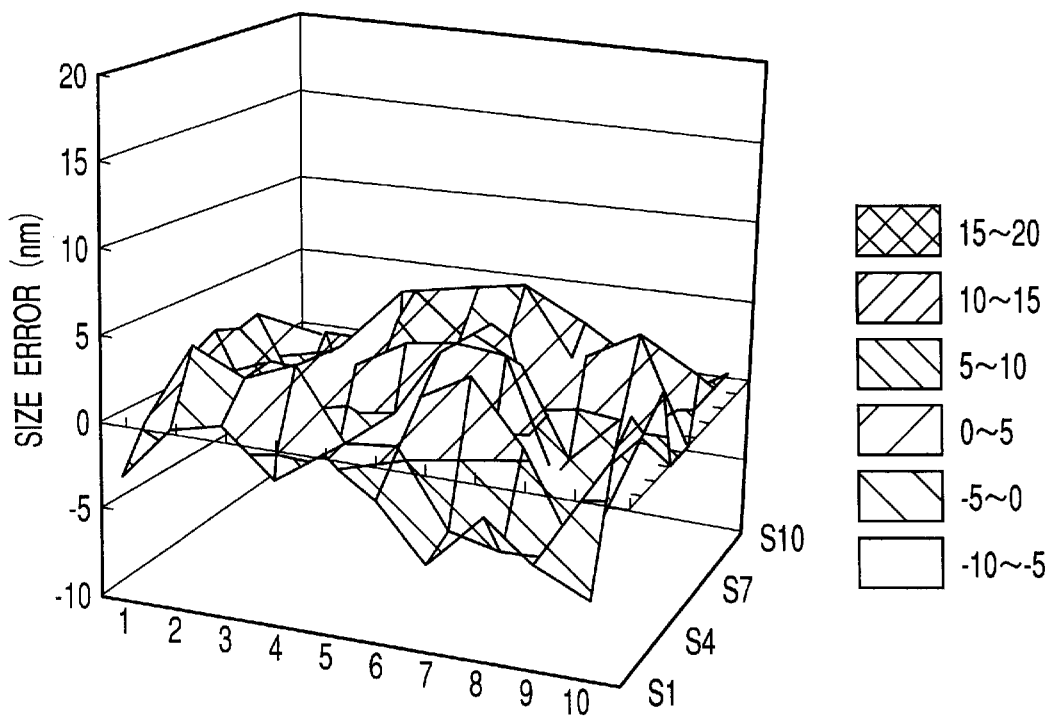
FIG. 4 is a graph showing the accuracy of the pattern size of a photomask fabricated by using a resist according to the embodiment of the present invention.
Figure 5:
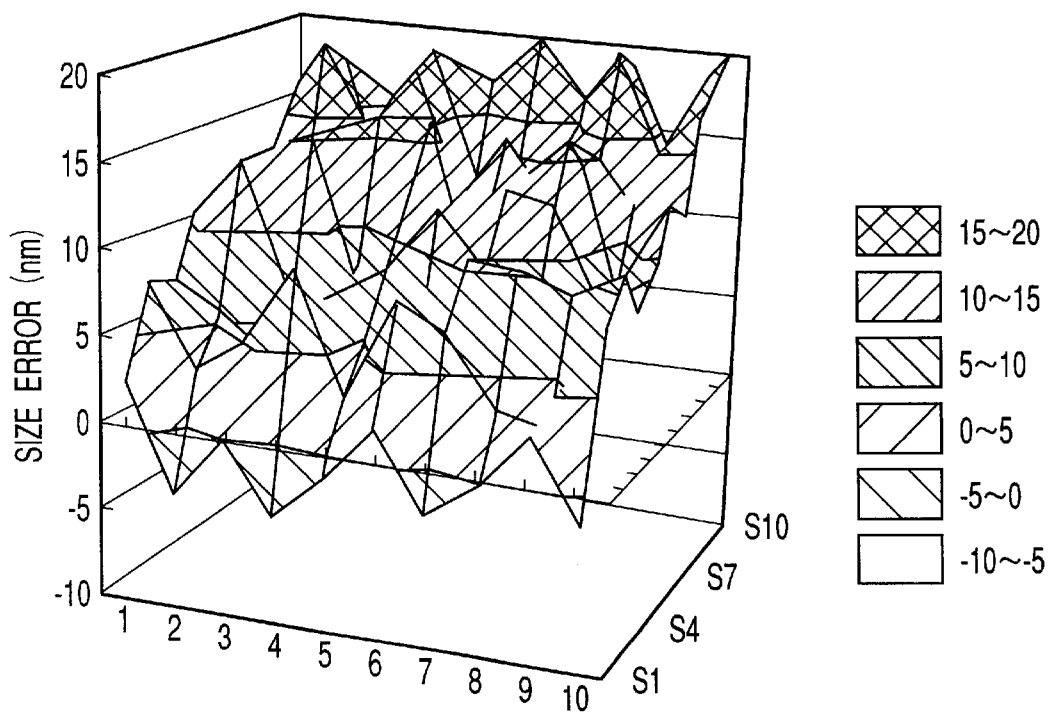
FIG. 5 is a graph showing the accuracy of the pattern size of a photomask fabricated by using a resist according to comparative example of the present invention.

FIG. 4 is a graph showing the accuracy of the pattern size of the photomask 30 fabricated by using the resist according to the embodiment of the present invention. FIG. 5 is a graph showing the accuracy of the pattern size of the photomask 30 fabricated by using the resist according to the comparative example of the present invention. FIGS. 4 and 5 are drawn on the basis of data measured at 10×10=100 points on the surfaces of these masks.

As shown in FIG. 4, the in-plane uniformity of the pattern size of the light-shielding pattern 31 of the photomask 30 fabricated by using the resist according to the embodiment of the present invention was extraordinarily high, and the size variation was 3 σ=7 nm, a satisfactory value. By contrast, as shown in FIG. 5, the pattern size of the light-shielding pattern 31 of the photomask 30 fabricated by using the resist according to the comparative example had a distribution inclined from one end to the other of the photomask 30, and the size variation was 3 σ=18 nm, an unsatisfactory value. That is, the sensitivity of the resist according to the comparative example increased with the elapse of the vacuum standing time after writing. Consequently, the aperture width of the light-shielding pattern 31 increased at the writing start position and relatively decreased at the writing end position.

As described above, high dimensional accuracy can be realized when the resist according to the embodiment of the present invention is used. Hence, the use of the resist according to the embodiment of the present invention can improve the fabrication yield of the photomask 30 and can also greatly extend the margin of wafer exposure. This makes it possible to greatly improve the fabrication yield of semiconductor devices such as DRAMs.

In the above embodiment, the present invention is applied to a binary chemically amplified resist. However, similar effects can be obtained by applying the present invention to a ternary chemically amplified resist. Also, in the above embodiment the molar ratio of the acetal-type functional group to the t-BOC group is 5:95. However, the molar ratio is not restricted to this ratio as long as the size variation corresponding to the vacuum standing time can be decreased to almost zero. Furthermore, although the acetal-type functional group and the t-BOC group are used as dissolution inhibiting groups, another functional group can also be used. Also, in the above embodiment the photomask was fabricated using the chemically amplified resist whose size variation corresponding to the vacuum standing time was almost zero. However, this resist can also be used in the fabrication of an X-ray lithography mask, EUV lithography mask, and electron beam exposure mask, and in direct writing for forming a resist pattern directly on a wafer.

In the present invention as has been described above, a first dissolution inhibiting group which increases the sensitivity of a pattern formation material when left to stand in a vacuum after irradiated with an electron beam and a second dissolution inhibiting group which decreases the sensitivity of a pattern formation material when left to stand in a vacuum after irradiated with an electron beam are used as dissolution inhibiting groups. By property adjusting the ratio of these dissolution inhibiting groups, a pattern can be formed by designed dimensions independently of the time of standing in a vacuum after electron beam irradiation.

That is, the present invention can realize high dimensional accuracy when patterning is performed using electron beam lithography. Accordingly, the present invention can provide a pattern formation material, pattern formation method, and exposure mask fabrication method capable of fabricating a pattern formation mask with high yield.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A pattern formation method using a pattern formation material for electron beam lithography, said pattern formation material comprising an alkali-soluble resin and a photoacid generator which generates an acid when irradiated with an electron beam, said pattern formation material further comprising first and second dissolution inhibiting groups each of which has a capacity of inhibiting dissolution of said alkali-soluble resin in an alkali solution and loses the capacity upon application of an acid, said first dissolution inhibiting group increasing a sensitivity of said pattern formation material when left to stand in a vacuum after irradiation with an electron beam, and said second dissolution inhibiting group decreasing the sensitivity of said pattern formation material when left to stand in a vacuum after irradiation with an electron beam, comprising:

determining a ratio of said first dissolution inhibiting group to said second dissolution inhibiting group such that a size of an alkali-soluble portion, which is a portion made soluble in said alkali solution when said pattern formation material is irradiated with an electron beam, is substantially held constant independently of a standing time in a vacuum;

forming a photosensitive film by coating a surface of an object to be processed with said pattern formation material containing said first and second dissolution inhibiting groups at the determined ratio;

performing electron beam writing on said photosensitive film in a vacuum;

forming a patterned film by developing said photosensitive film subjected to the electron beam writing, and etching the surface of said object to be processed by using said patterned film as an etching mask.

2. A method according to claim 1, wherein at least one of said first and second dissolution inhibiting groups is a functional group which modifies said alkali-soluble resin.

3. A method according to claim 1, wherein said pattern formation material further comprises a dissolution inhibitor, and at least one of said first and second dissolution inhibiting groups is a functional group which forms said dissolution inhibitor.

4. A method according to claim 1, wherein said first dissolution inhibiting group is a t-butoxycarbonyloxy group.

5. A method according to claim 1, wherein said second dissolution inhibiting group is an acetal-type functional group.

6. A method according to claim 1, wherein the ratio of said first dissolution inhibiting group to said second dissolution inhibiting group is adjusted such that a difference between the size of said alkali-soluble portion immediately after irradiated with an electron beam in a vacuum and the size of said alkali-soluble portion left to stand for 10 hr in a vacuum after irradiated with an electron beam is not more than ±5 nm.

7. An exposure mask fabrication method using a pattern formation material for electron beam lithography, said pattern formation material comprising an alkali-soluble resin and a photoacid generator which generates an acid when irradiated with an electron beam, said pattern formation material further comprising first and second dissolution inhibiting groups each of which has a capacity of inhibiting dissolution of said alkali-soluble resin in an alkali solution and loses the capacity upon application of an acid, said first dissolution inhibiting group increasing a sensitivity of said pattern formation material when left to stand in a vacuum after irradiation with an electron beam, and said second dissolution inhibiting group decreasing the sensitivity of said pattern formation material when left to stand in a vacuum after irradiation with an electron beam, comprising:

determining a ratio of said first dissolution inhibiting group to said second dissolution inhibiting group such that a size of an alkali-soluble portion, which is a portion made soluble in said alkali solution when said pattern formation material is irradiated with an electron beam, is substantially held constant independently of a standing time in a vacuum;

forming a light-shielding film on one principal surface of a transparent substrate;

forming a photosensitive film by coating the surface of said light-shielding film with said pattern formation material containing said first and second dissolution inhibiting groups at the determined ratio;

performing electron beam writing on said photosensitive film in a vacuum;

forming a patterned film by developing said photosensitive film subjected to the electron beam writing; and etching said light-shielding film by using said patterned film as an etching mask.

8. A method according to claim 7, wherein at least one of said first and second dissolution inhibiting groups is a functional group which modifies said alkali-soluble resin.

9. A method according to claim 7, wherein said pattern formation material further comprises a dissolution inhibitor, and at least one of said first and second dissolution inhibiting groups is a functional group which forms said dissolution inhibitor.

10. A method according to claim 7, wherein said first dissolution inhibiting group is a t-butoxycarbonyloxy group.

11. A method according to claim 7, wherein said second dissolution inhibiting group is an acetal-type functional group.

12. A method according to claim 7, wherein the ratio of said first dissolution inhibiting group to said second dissolution inhibiting group is adjusted such that a difference between the size of said alkali-soluble portion immediately after irradiated with an electron beam in a vacuum and the size of said alkali-soluble portion left to stand for 10 hr in a vacuum after irradiated with an electron beam is not more than ±5 nm.

* * * * *